United States Patent [19]
Shimoe

[11] Patent Number: 5,986,524
[45] Date of Patent: Nov. 16, 1999

[54] SURFACE ACOUSTIC WAVE RESONATOR FILTER WITH A WEIGHTED ASYMMETRICAL INTERDIGITAL ELECTRODE

[75] Inventor: Kazunobu Shimoe, Kanazawa, Japan

[73] Assignee: Murata Manufacturing Co., Ltd., Japan

[21] Appl. No.: 08/976,798

[22] Filed: Nov. 24, 1997

[30] Foreign Application Priority Data

Dec. 25, 1996 [JP] Japan ................................ 8-345477

[51] Int. Cl.[6] .................... H03H 9/145; H03H 9/25; H03H 9/64
[52] U.S. Cl. ................. 333/195; 333/196; 333/194; 310/313 C; 310/313 D
[58] Field of Search ................. 333/193–196; 310/313 R, 313 B, 313 C, 313 D

[56] References Cited

U.S. PATENT DOCUMENTS

| | | | |
|---|---|---|---|
| 5,130,681 | 7/1992 | Ohnuki et al. | 310/313 B |
| 5,309,126 | 5/1994 | Allen | 310/313 B |
| 5,485,052 | 1/1996 | Seki et al. | 310/313 D |
| 5,548,256 | 8/1996 | Watanabe et al. | 333/194 |

FOREIGN PATENT DOCUMENTS

| | | | |
|---|---|---|---|
| 64-82706 | 3/1989 | Japan | 333/195 |
| 3-112210 | 5/1991 | Japan | 333/194 |
| 5-121997 | 5/1993 | Japan | 333/193 |
| 8-91229 | 7/1996 | Japan | 333/194 |
| 8-330889 | 12/1996 | Japan | 333/194 |

OTHER PUBLICATIONS

M.A. Sharif et al.; "Coupled Resonator Filters with Differential Input and/or Differential Output"; *1995 IEEE Ultrasonics Symposium*; vol. 1, p. 67–70; Nov. 7–10, 1995, Seattle, WA, USA.

*Primary Examiner*—Robert Pascal
*Assistant Examiner*—Barbara Summons
*Attorney, Agent, or Firm*—Graham & James LLP

[57] ABSTRACT

A three-electrode longitudinally-coupled-type SAW resonator filter has an improved level of selectivity by effectively suppressing unwanted large spurious responses generated in a range higher than the pass band. A first ID electrode, a second ID electrode and a third ID electrode are disposed on a piezoelectric substrate. Reflectors are provided on one side of each of the second and third ID electrodes, respectively. A center distance $L_1$ between the most adjacent electrode fingers of the respective first and second ID electrodes is differentiated from the center distance $L_2$ between the most adjacent electrode fingers of the respective first and third ID electrodes. Further, the first ID electrode is weighted to more effectively suppress undesired spurious responses.

14 Claims, 3 Drawing Sheets

SURFACE ACOUSTIC WAVE RESONATOR FILTER WITH A WEIGHTED ASYMMETRICAL INTERDIGITAL ELECTRODE

BACKGROUND OF THE INVENTION

1. Field of the Invention

The present invention relates to a longitudinally-coupled-type surface-acoustic-wave (SAW) resonator filter in which reflectors are provided at both sides of a region where interdigital electrodes are located. More particularly, the invention relates to the above-described type of longitudinally-coupled-type SAW resonator filter having an improved electrode structure in which unwanted spurious responses are suppressed.

2. Description of the Related Art

SAW filters are being used as band-pass filters for various types of communication devices. It is critically important that band-pass filters ensure required pass bandwidths with high selectivity. Accordingly, it is also required that a SAW filter used in a high-frequency stage reliably provide a required pass bandwidth with high selectivity. It is particularly important that RF-stage SAW filters used in cordless telephones having CT-1, CT-1$^+$, and CT-2 standards obtain attenuations in ranges of ±20 MHz and ±40 MHz away from the center frequency, though these ranges vary depending on the intermediate frequency (IF) filters used in the telephones. Thus, the RF-stage SAW filters are required to have even higher selectivity characteristics.

On the other hand, resonator-type SAW filters are advantageous compared to other types of SAW filters in terms of decreased insertion losses and increased out-of-band attenuations and also provide a more compact filter. For example, certain types of longitudinally-coupled-type SAW resonator filters are connected in a plurality of stages to sufficiently satisfy the foregoing requirements. In this type of SAW filter, three interdigital (hereinafter referred to as "ID") electrodes are arranged in proximity with each other at an equal pitch on a 36°-Y-cut X-direction-propagating LiTaO$_3$ piezoelectric substrate, and reflectors are disposed at both sides of a region where the ID electrodes are located.

However, in the foregoing conventional longitudinally-coupled-type SAW resonator filter, unwanted spurious responses are generated in a frequency range higher than the pass band. FIG. 3 illustrates the attenuation-vs.-frequency characteristics of a known longitudinally-coupled-type SAW resonator filter. The solid line A indicates an enlarged essential portion of the characteristics represented by the solid line B with a scale on the right side of the vertical axis of FIG. 3. The longitudinally-coupled-type SAW resonator filter having the characteristics shown in FIG. 3 has a pass band from 864 to 868 MHz. In the above-described characteristics, large spurious responses indicated by the arrow C appear in a frequency range higher than the pass band, i.e., in the vicinity of 890 MHz, where a sufficiently large attenuation cannot be obtained.

A method for suppressing the above-described spurious responses C is disclosed in Japanese Unexamined Patent Publication No. 8-191229. This method includes a technique for differentiating a distance between a center ID electrode and one peripheral ID electrode from a distance between the center ID electrode and the other peripheral ID electrode. The longitudinally-coupled-type SAW resonator filter disclosed in this publication is shown in FIG. 4.

A longitudinally-coupled-type SAW resonator filter generally indicated by 10 has a structure in which a first ID electrode 14 and second and third ID electrodes 12 and 13 are arranged side by side on a piezoelectric substrate 11 in the direction in which a surface wave propagates. More specifically, the second and third ID electrodes 12 and 13 are respectively disposed at oppositeg sides of the first ID electrode 14. Reflectors 15, 15 are disposed at one side of the ID electrode 12 and at one side of the ID electrode 13, respectively, in the surface-wave propagating direction.

The second and third ID electrodes 12 and 13 are connected to an input terminal 21, while the first ID electrode 14 is connected to an output terminal 22. A voltage is applied to the ID electrodes 12 and 13 to generate a surface wave. The excited surface wave is then trapped in a range between the reflectors 15, 15 to generate a standing wave, and an output in accordance with the standing wave is extracted from the first ID electrode 14.

In the SAW resonator filter 10, the distance between the first ID electrode 14 and the second ID electrode 12, i.e., the center distance $L_1$ between the most adjacent electrode fingers of the respective ID electrodes 14 and 12, is differentiated from the distance between the first ID electrode 14 and the third ID electrode 13, i.e., the center distance $L_2$ between the most adjacent electrode fingers of the respective ID electrodes 14 and 13.

However, when the SAW resonator filters 10 illustrated in FIG. 4 are connected in two stages, the following problem occurs. In this filter 10, the center distances $L_1$ and $L_2$ are differentiated, which thereby generates an attenuation pole designated by the arrow F in FIG. 5 in a range higher than the pass band where a large attenuation can be obtained. On the other hand, the foregoing large unwanted spurious responses C can only be slightly suppressed and are not sufficiently prevented, as indicated by the attenuation-vs.-frequency characteristics illustrated in FIG. 5. In FIG. 5, the solid line D represents an enlarged essential portion of the characteristics indicated by the solid line E with a scale on the right side of the vertical axis of FIG. 5. Upon comparison of FIG. 5 with FIG. 3, it is seen that the unwanted spurious responses C are not significantly reduced.

SUMMARY OF THE INVENTION

To overcome the problems described above, the preferred embodiments of the present invention provide a longitudinally-coupled-type SAW filter having improved selectivity characteristics by effectively suppressing large spurious responses appearing in a range higher than a pass band of the filter.

According to a preferred embodiment of the present invention, a longitudinally-coupled-type SAW resonator filter includes a first ID electrode having at least one electrode finger, a second ID electrode and a third ID electrode which are respectively disposed at opposite sides of the first ID electrode in a direction in which a surface wave propagates. The second and third ID electrodes each have at least one electrode finger. The filter also has a reflector. A center distance $L_1$ between the most adjacent finger electrodes of the first ID electrode and the second ID electrode is different than a center distance $L_2$ between the most adjacent finger electrodes of the first ID electrode and the third ID electrode. At least one of the first, second and third ID electrodes is weighted.

In the foregoing resonator filter, since the first, second and third ID electrodes are arranged as described above with the different center distances $L_1$ and $L_2$, an attenuation pole is generated in a range higher than the pass band where large spurious responses are suppressed. Further, at least one ID electrode is weighted, to thereby more effectively inhibit the above spurious responses.

Therefore, when the foregoing filter is used as a cordless-telephone RF filter, attenuations in ranges of ±20 MHz and ±40 MHz away from the center frequency can be reliably obtained. Thus, the resonator filter achieves a high level of selectivity.

In the above type of SAW resonator filter, the weighted ID electrode may be asymmetrical with respect to the center of the ID electrode. Accordingly, large spurious responses in a range higher than the pass band can be more effectively reduced.

Further, the ID electrode may be weighted according to an electrode-finger withdrawal method. This makes it possible to increase easy designing and patterning of the filter.

DETAILED DESCRIPTION OF PREFERRED EMBODIMENTS

An explanation will now be given of a SAW resonator filter constructed in accordance with a preferred embodiment of the present invention with reference to the drawings.

Figure 1:
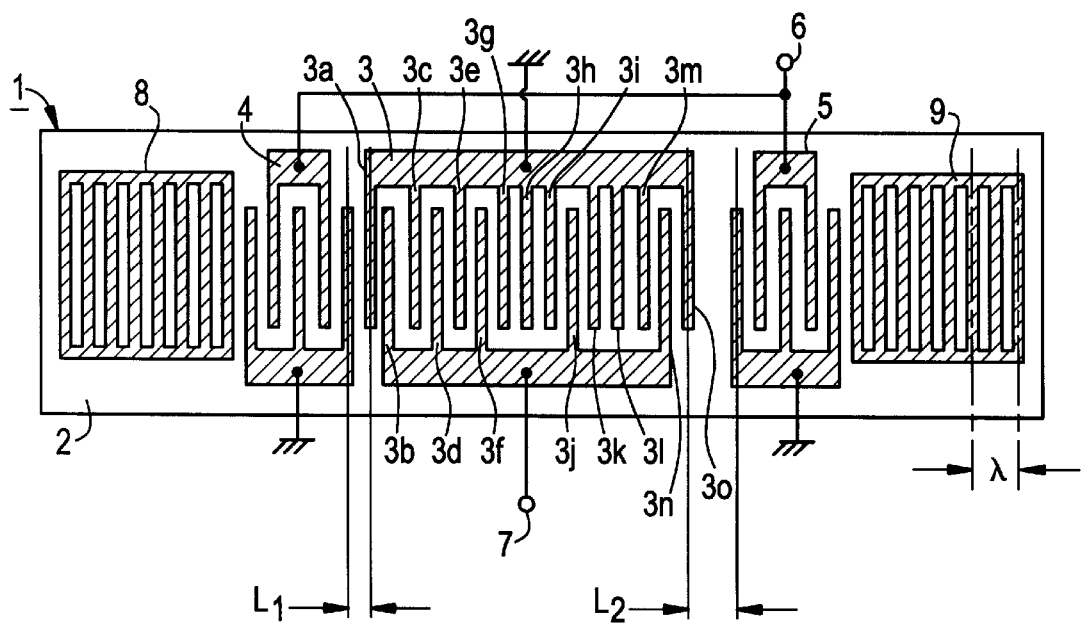
FIG. 1 is a plan view illustrating the configuration of a longitudinally-coupled-type SAW resonator filter according to a preferred embodiment of the present invention.

Referring to the plan view shown in FIG. 1, a longitudinally-coupled-type SAW resonator filter generally designated by 1 includes a piezoelectric substrate 2. The piezoelectric substrate 2 is preferably made from a piezoelectric single-crystal, such as $LiTaO_3$, $LiNbO_3$ or quartz, or a piezoelectric ceramic, such as a lead titanate zirconate ceramic.

A first ID electrode 3, a second ID electrode 4 and a third ID electrode 5 are respectively disposed on opposite sides of the first ID electrode 3 in the surface-wave-propagating direction of the piezoelectric substrate 2. The ID electrodes 3, 4 and 5 each preferably include a pair of comb-like electrodes, each electrode having at least one electrode finger, the fingers being interdigitated with each other.

In the above-described structure of the SAW filter 1, the second and third ID electrodes 4 and 5 define an input ID transducer, with one comb-like electrode of each of the ID electrodes 4 and 5 being electrically connected to an input terminal 6. The first ID electrode 3 defines an output ID transducer, with one comb-like electrode of the ID electrode 3 being electrically connected to an output terminal 7.

Reflectors 8 and 9 are provided at one side of each of the second and third ID electrodes 4 and 5, respectively, in the surface-wave-propagating direction. The reflectors 8 and 9 are configured in such a manner that a plurality of short-circuited electrode fingers are positioned in a direction that is substantially orthogonal to the surface-wave-propagating direction. The ID electrodes 3, 4 and 5 and the reflectors 8 and 9 can be formed by patterning a conductive material. The type of conductive material is not particularly restricted, and a suitable metal material, such as aluminum or an aluminum alloy, may be used.

In the above-described SAW resonator filter 1, the center distance $L_1$ between the most adjacent electrode fingers of the respective first and second ID electrodes 3 and 4 is differentiated from the center distance $L_2$ between the most adjacent electrode fingers of the respective first and third ID electrodes 3 and 5. Further, the first ID electrode 3 is weighted.

Figure 4:
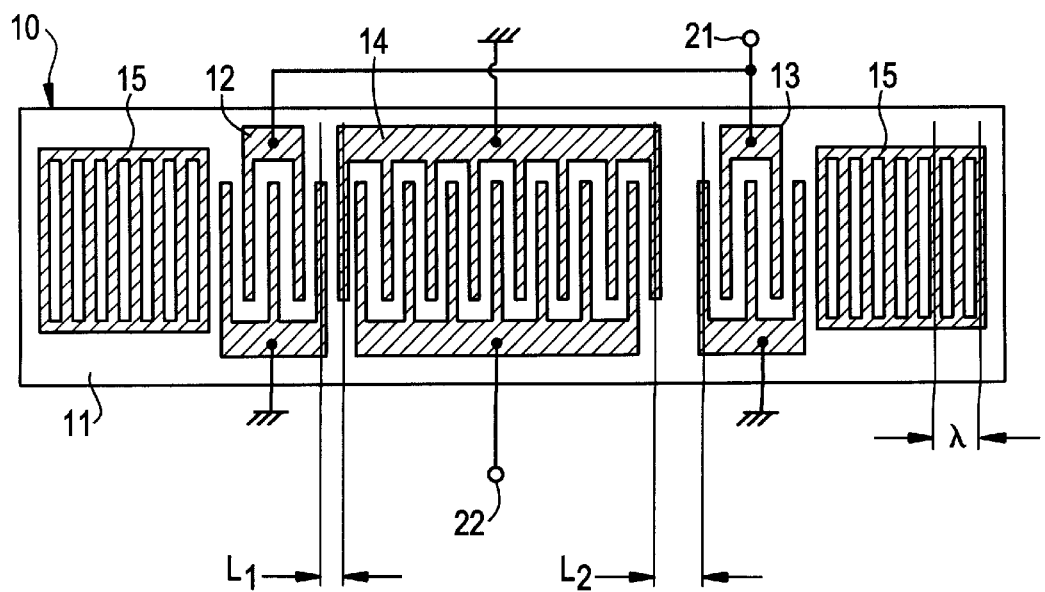
FIG. 4 is a plan view illustrating the configuration of a related longitudinally-coupled-type SAW resonator filter.

That is, in the SAW resonator filter 1, the center distances $L_1$ and $L_2$ are differentiated so as to prevent large unwanted spurious responses from being generated in a range higher than the pass band, in a manner similar to the known SAW resonator filter 10 shown in FIG. 4. However, the above types of large unwanted spurious responses can be more sufficiently suppressed by modifying this arrangement. Accordingly, the ID electrode 3 is weighted, as illustrated in FIG. 1, asymmetrically in the surface-wave-propagating direction.

More specifically, if the ID electrode 3 is a typical normalized ID electrode, electrode fingers 3a, 3c, 3e, 3g, 3i, 3k, 3m and 3o are connected to a ground potential, while electrode fingers 3b, 3d, 3f, 3h, 3j, 3l and 3n are connected to the output terminal 7. In contrast, in the ID electrode 3 illustrated in FIG. 1, the electrode fingers 3h and 3l, which are conventionally connected to the output terminal, are connected to a ground terminal.

Changes in the connection of predetermined electrode fingers from a signal terminal (an input or output terminal) to a ground terminal, and vice versa, are generally referred to as "electrode-finger withdrawal". A plurality of electrode fingers are withdrawn in the above manner to change the arrangement of the electrode fingers of the ID electrodes. This is referred to as "the withdrawal weighting" method. Namely, the ID electrode 3 is weighted asymmetrically with respect to the surface-wave-propagating direction, as noted above.

In the SAW resonator filter 1 constructed as described above, the unwanted spurious responses generated in a range higher than the pass band are effectively suppressed. This is because the center distances $L_1$ and $L_2$ of the ID electrodes of the filter 1 are differentiated so as to generate an attenuation pole in a range higher than the pass band where the attenuation is increased. In this configuration of the filter 1, the ID electrode 3 is further weighted as described above. In view of this background, the preferred embodiments of the present invention was completed through an intense study and analysis performed by the present inventor.

Previously, an attempt has been made to adjust the frequency characteristics of a SAW filter by weighting the ID electrodes. This weighting method is, however, only used for mainly inhibiting a spurious response generated in the side-lobe of the ID electrodes and a transverse spurious response. In other words, it is impossible to suppress spurious responses generated in the main lobe of the ID electrodes by conventional weighting methods.

In contrast, the preferred embodiments of the present invention has been completed by the present inventor through the following discovery. In the foregoing type of longitudinally-coupled-type SAW resonator filter constructed in which the center distances $L_1$ and $L_2$ are differentiated, the spurious responses generated in the main lobe is effectively suppressed by weighting at least one ID electrode.

Thus, the ID-electrode weighting method used in the preferred embodiments of the present invention cannot be anticipated from the conventional weighting method for suppressing the spurious responses generated in the side-lobe and transverse-mode spurious responses.

In particular, the method for suppressing spurious responses by asymmetrically weighting the ID electrode is effective only when the center distances $L_1$ and $L_2$ are differentiated. Even if the above method is applied to a three-electrode longitudinally-coupled-type SAW resonator filter utilizing a zero-order or second-order mode in which the center distances $L_1$ and $L_2$ are not differentiated, the symmetry of the filter characteristics is disturbed, thereby generating the first-order mode in the pass band as large spurious responses.

According to the longitudinally-coupled-type SAW resonator filter of the preferred embodiments of the present invention, the weighting method, which has been considered to be ineffective for suppressing the main-lobe spurious responses in a known SAW resonator filter, is deliberately utilized while the center distances $L_1$ and $L_2$ are differentiated. As a consequence, unwanted spurious responses generated in a range higher than the pass band are effectively prevented, thereby improving the selectivity characteristics of the SAW resonator filter.

Although in the foregoing preferred embodiment, only the ID electrode 3 is weighted, either or both of ID electrodes 4 and 5 may be weighted in addition to the ID electrode 3. Alternatively, at least one of the ID electrodes 4 and 5 rather than the ID electrode 3 may be weighted. Moreover, the ID electrode may be weighted symmetrically rather than asymmetrically in the surface-wave-propagating direction. The ID electrode may preferably be asymmetrically weighted because the spurious responses generated in a range higher than the pass band are reduced more effectively.

The weighting method is not restricted to the foregoing electrode-finger withdrawal method, but may be other methods, such as the apodization method or the slant weighting method.

Additionally, in place of the piezoelectric substrate 2, a quasi-piezoelectric substrate obtained by coating an insulating substrate with a piezoelectric thin film may be used, in which case, the ID electrodes 3, 4 and 5 and the reflectors 8 and 9 may be disposed on either of the upper or lower surface of the piezoelectric thin film.

The effect of the longitudinally-coupled-type SAW resonator filter of the present invention will now be clarified through illustration of a preferred embodiment.

The SAW resonator filter 1 illustrated in FIG. 1 was formed under the following conditions: a 36°-Y-cut X-direction-propagating LiTaO$_3$ piezoelectric substrate 2 was used, the number of electrode fingers of the first ID electrode 3 was 71, the number of electrode fingers of each of the second and third ID electrodes 4 and 5 was 41, the center distances $L_1$ and $L_2$ were about 0.35λ and about 0.71λ, respectively, the number of electrode fingers of each of the reflectors 8 and 9 was 170, the thickness of the electrodes of the reflectors 8 and 9 was 3.6% of the wavelength λ, and the ID electrode 3 was weighted asymmetrically in the surface-wave-propagating direction according to the electrode-finger withdrawal method. More specifically, the ID electrode 3 was weighted in the following manner. The electrode fingers of a typical normalized ID electrode are withdrawn by connecting the 30th, 32nd, 34th, 36th, 38th, 54th, 58th, 62nd, 66th, and 68th electrode fingers from the left side of FIG. 1 to a ground terminal. λ indicates the wavelength of the surface wave which is determined by the electrode pitch of the reflectors 8 and 9. Aluminum was used for the material for the ID electrodes 3, 4 and 5 and the reflectors 8 and 9.

Figure 2:
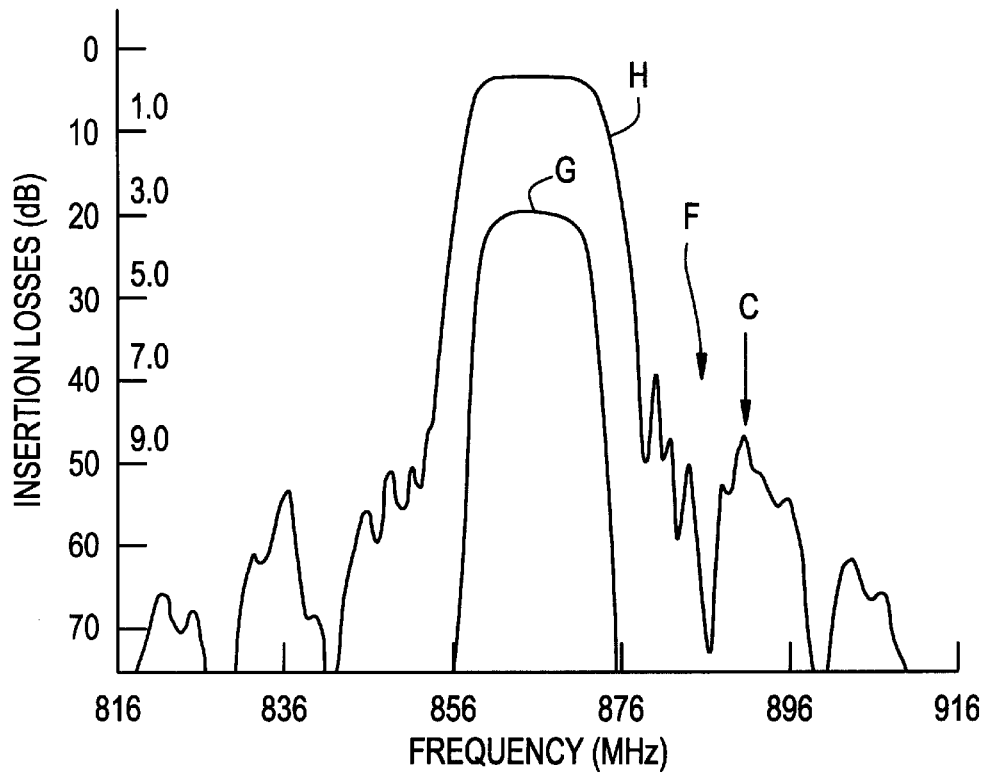
FIG. 2 illustrates the attenuation-vs.-frequency characteristics of a longitudinally-coupled-type SAW resonator filter according to a preferred embodiment of the present invention.
Figure 3:
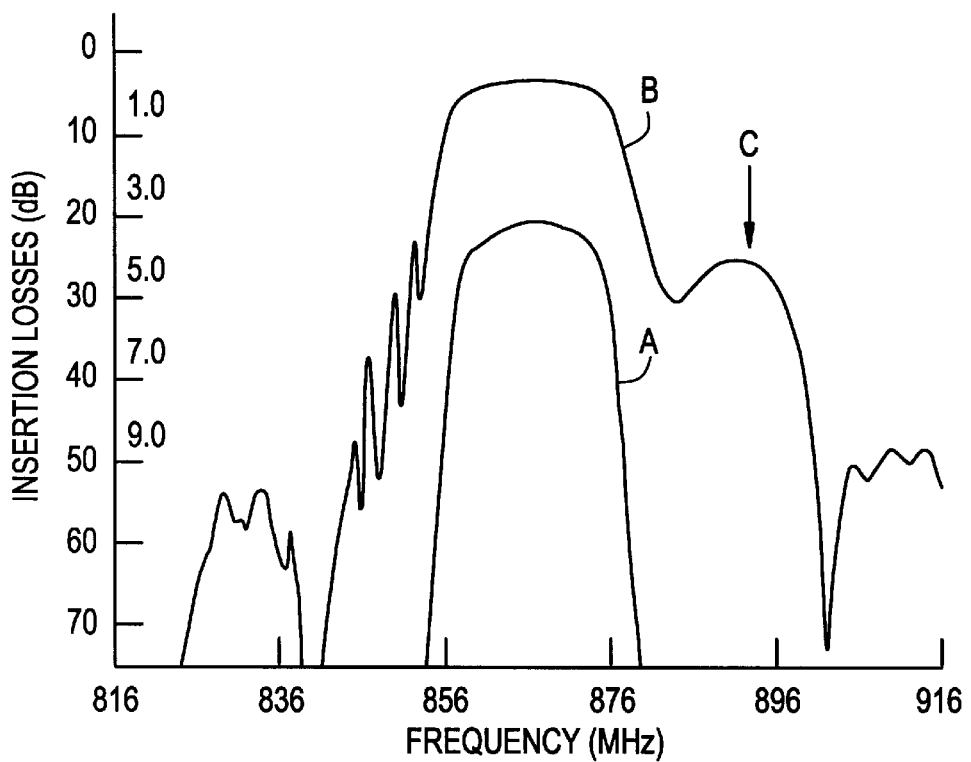
FIG. 3 illustrates the attenuation-vs.-frequency characteristics of a known longitudinally-coupled-type SAW resonator filter.

The foregoing longitudinally-coupled-type SAW resonator filters 1 were connected in two stages and used as a CT-2 standard cordless-telephone RF filter having a center frequency of 866 MHz. The attenuation-vs.-frequency characteristics of the filter were measured. The results are shown in FIG. 2. In FIG. 2, the solid line G indicates an enlarged essential portion of the characteristics represented by the solid line H with respect to the insertion losses with a scale on the right side of the vertical axis of FIG. 2.

For comparison, the longitudinally-coupled-type SAW resonator filters 10 shown in FIG. 4 used as a comparative example constructed in a manner similar to the filter 1 except that the ID electrode 3 was not weighted were connected in two stages and used as a CT-2 standard cordless telephone RF filter. The attenuation-vs.-frequency characteristics of the filter 10 were measured. The results are indicated by the solid lines D and E of FIG. 5.

Figure 5:
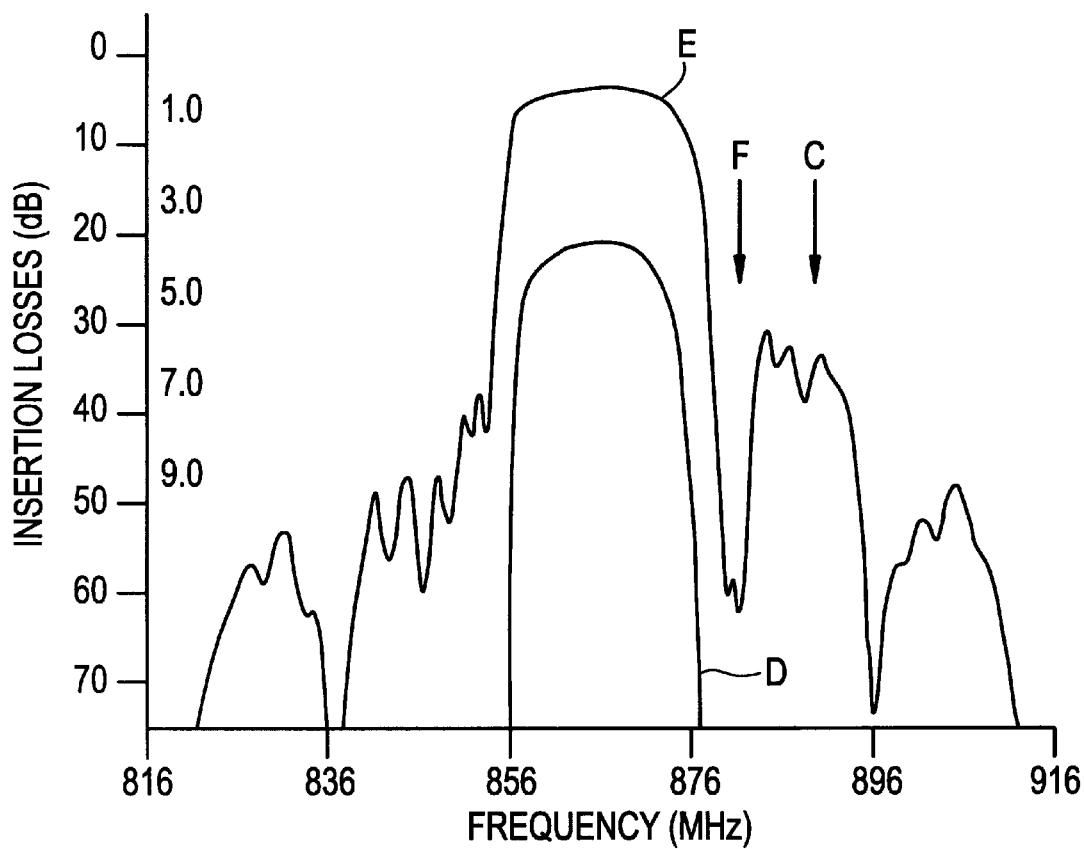
FIG. 5 illustrates the attenuation-vs.-frequency characteristics of a known longitudinally-coupled-type SAW resonator filter used as a comparative example.

As discussed above, according to the characteristics of the known filter 10 shown in FIG. 5, the center distances $L_1$ and $L_2$ are differentiated, thereby forming an attenuation pole where the attenuation indicated by the arrow F can be increased. However, the unwanted spurious responses C are only slightly reduced and are not sufficiently suppressed, and the attenuation of the region indicated by the arrow C is as low as about 30 dB.

In contrast, the characteristics of the SAW resonator filter 1 of the preferred embodiments shown in FIG. 2 reveal that large spurious responses C emerging in a range higher than the pass band are more effectively suppressed, and the attenuation is as high as 40 dB or more. Moreover, the characteristics of the filter 1, such as the out-of-band insertion losses and the pass bandwidth, are not effected by weighting the ID electrode by the electrode-finger withdrawal method.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A longitudinally-coupled-type surface-acoustic-wave resonator filter comprising:

a first interdigital electrode having at least one electrode finger;

a second interdigital electrode;

a third interdigital electrode, the second interdigital electrode being located at one side of said first interdigital electrode and the third interdigital electrode being located at another side of said first interdigital electrode in a direction in which a surface wave propagates, said second and third interdigital electrodes each having at least one electrode finger; and a pair of reflectors disposed so that said first, second and third interdigital electrodes interpose said pair of reflectors which are arranged to confine said surface acoustic wave so as to generate a standing wave, whereby an output in accordance with said standing wave is extracted from said first interdigital electrode;

wherein a center distance $L_1$ between adjacent finger electrodes of said first interdigital electrode and said second interdigital electrode is different compared to a center distance $L_2$ between adjacent finger electrodes of said first interdigital electrode and said third interdigital electrode, and wherein at least one of said first, second and third interdigital electrodes is weighted; and the at least one of said first, second and third interdigital electrodes which is weighted is asymmetrical with respect to a center of said at least one weighted interdigital electrode.

2. A longitudinally-coupled-type surface-acoustic-wave resonator filter according to claim 1, wherein said second and third interdigital electrodes are not weighted.

3. A longitudinally-coupled-type surface-acoustic-wave resonator filter according to claim 1, wherein the weighted interdigital electrode is weighted according to an electrode-finger withdrawal method.

4. A longitudinally-coupled-type surface-acoustic-wave resonator filter according to claim 1, wherein each of said first, second and third interdigital electrodes is weighted.

5. A longitudinally-coupled-type surface-acoustic-wave resonator filter according to claim 1, further comprising a piezoelectric substrate upon which the first, second and third interdigital electrodes are disposed.

6. A longitudinally-coupled-type surface-acoustic-wave resonator filter according to claim 1, further comprising an insulating substrate having a piezoelectric thin film disposed thereon, wherein the first, second and third interdigital electrodes are disposed on the piezoelectric thin film.

7. A longitudinally-coupled-type surface-acoustic-wave resonator filter according to claim 1, wherein only said first interdigital electrode is weighted.

8. A longitudinally-coupled-type surface-acoustic-wave resonator filter comprising:

a first interdigital electrode having at least one electrode finger;

a second interdigital electrode;

a third interdigital electrode, the second interdigital electrode being located at one side of said first interdigital electrode and the third interdigital electrode being located at another side of said first interdigital electrode in a direction in which a surface wave propagates, said second and third interdigital electrodes each having at least one electrode finger; and a reflector;

wherein a center distance $L_1$ between adjacent finger electrodes of said first interdigital electrode and said second interdigital electrode is different compared to a center distance $L_2$ between adjacent finger electrodes of said first interdigital electrode and said third interdigital electrode, and wherein at least one of said first, second and third interdigital electrodes is weighted, at least one of said first, second and third interdigital electrodes which is weighted is asymmetrical with respect to a center of said at least one weighted interdigital electrode.

9. The longitudinally-coupled-type surface-acoustic-wave resonator filter according to claim 8, wherein said second and third interdigital electrodes are not weighted.

10. The longitudinally-coupled-type surface-acoustic-wave resonator filter according to claim 8, wherein the weighted interdigital electrode is weighted according to an electrode-finger withdrawal method.

11. The longitudinally-coupled-type surface-acoustic-wave resonator filter according to claim 8, wherein each of said first, second and third interdigital electrodes is weighted.

12. The longitudinally-coupled-type surface-acoustic-wave resonator filter according to claim 8, further comprising a piezoelectric substrate upon which the first, second and third interdigital electrodes are disposed.

13. The longitudinally-coupled-type surface-acoustic-wave resonator filter according to claim 8, further comprising an insulating substrate having a piezoelectric thin film disposed thereon, wherein the first, second and third interdigital electrodes are disposed on the piezoelectric thin film.

14. The longitudinally-coupled-type surface-acoustic-wave resonator filter according to claim 8, wherein only said first interdigital electrode is weighted.

* * * * *